(12) United States Patent
Hwang et al.

(10) Patent No.: US 9,324,670 B2
(45) Date of Patent: Apr. 26, 2016

(54) SEMICONDUCTOR DEVICE WITH COPPER-TIN COMPOUND ON COPPER CONNECTOR

(71) Applicant: Taiwan Semiconductor Manufacturing Company, Ltd., Hsin-Chu (TW)

(72) Inventors: Chien Ling Hwang, Hsin-Chu (TW);
Yi-Li Hsiao, Hsin-Chu (TW);
Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 14/157,220

(22) Filed: Jan. 16, 2014

(65) Prior Publication Data

US 2014/0131863 A1    May 15, 2014

Related U.S. Application Data

(62) Division of application No. 12/891,487, filed on Sep. 27, 2010, now Pat. No. 8,679,591.

(60) Provisional application No. 61/262,021, filed on Nov. 17, 2009.

(51) Int. Cl.
  *H01L 23/48* (2006.01)
  *H01L 23/52* (2006.01)
  *H01L 29/40* (2006.01)
  *H01L 23/00* (2006.01)

(52) U.S. Cl.
  CPC ............. *H01L 24/13* (2013.01); *H01L 24/11* (2013.01); *H01L 2224/13099* (2013.01); *H01L 2224/16* (2013.01); *H01L 2924/014* (2013.01); *H01L 2924/01006* (2013.01); *H01L 2924/01011* (2013.01); *H01L 2924/01029* (2013.01); *H01L 2924/01033* (2013.01); *H01L 2924/01082* (2013.01); *H01L 2924/14* (2013.01)

(58) Field of Classification Search
  CPC .................. H01L 2224/13099; H01L 2224/16; H01L 24/11; H01L 24/13; H01L 2924/01006; H01L 2924/01011; H01L 2924/01029; H01L 2924/01033; H01L 2924/01082; H01L 2924/014; H01L 2924/14
  See application file for complete search history.

(56) References Cited

U.S. PATENT DOCUMENTS

| 5,518,964 A | 5/1996 | DiStefano et al. |
| 2002/0064676 A1 | 5/2002 | Bokisa et al. |
| 2008/0173550 A1 | 7/2008 | Kiso et al. |
| 2011/0097577 A1 | 4/2011 | Soliman et al. |

FOREIGN PATENT DOCUMENTS

| TW | 200924064 A | 6/2009 |
| TW | 200939368 A | 9/2009 |
| TW | M368273 | 11/2009 |

*Primary Examiner* — Meiya Li
(74) *Attorney, Agent, or Firm* — Slater & Matsil, L.L.P.

(57) ABSTRACT

An embodiment is a method for forming a semiconductor assembly including cleaning a connector including copper formed on a substrate, applying cold tin to the connector, applying hot tin to the connector, and spin rinsing and drying the connector.

20 Claims, 4 Drawing Sheets ed at a higher temperature, such as between about 40° C. and 75° C.

SEMICONDUCTOR DEVICE WITH COPPER-TIN COMPOUND ON COPPER CONNECTOR

This application is a divisional of U.S. application Ser. No. 12/891,487, entitled "Method for Reducing Voids in a Copper-Tin Formed Thereby," filed on Sep. 27, 2010, which claims the benefit of U.S. Provisional Application No. 61/262,021, entitled "Method for Reducing Voids in a Copper-Tin Formed Thereby," filed on Nov. 17, 2009, both of which applications are incorporated herein by reference.

TECHNICAL FIELD

The disclosure relates generally to a method for semiconductor assembly processing and the semiconductor assembly formed thereby, and more particularly to a method for reducing voids in a copper-tin interface in the semiconductor assembly and the semiconductor assembly formed thereby.

BACKGROUND

As semiconductor devices continually decrease in size, the use of flip chip assemblies generally gains in popularity. Flip chip assemblies are semiconductor chips, or integrated circuits, that have external electrical pads on a surface of the chip to which solder pillars or bumps are connected. The pillars or bumps are then connected to a substrate or carrier using a soldering process. The pillars or bumps create a physical and electrical connection between the substrate and the chip. Further, generally an underfill is used to fill the space between substrate and the chip and around the pillars or bumps to give the flip chip assembly more mechanical strength.

The pillars or bumps typically comprise copper, although many forms of solder may be used. Further, the pillars or bumps are generally coated or immersed in tin to protect the bumps from external factors, such as corrosion, as well as to aid in the soldering process. However, by immersing the pillars or bumps in tin, voids may randomly occur at the interface between the copper in the pillar or bump and the tin. The voids may be generally around 200 nanometers wide. The voids may lead to weakened mechanical strength of the connection, may cause delamination of a semiconductor chip, and may lead to cracks in the pillars or bumps that can cause open electrical circuits.

The cause of the voids is not readily apparent. One theorized cause is that the presence of copper oxide or irregularities at the copper-tin interface prevents tin from reacting or bonding to the copper and forms irregular voids. Also, by depositing tin at a high temperature onto the copper, the reaction between the copper and the tin may cause lateral shear stresses that can cause the voids.

BRIEF DESCRIPTION OF THE DRAWINGS

For a more complete understanding of embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Some embodiments will be described with respect to a specific context, namely a flip chip assembly. Other embodiments may also include, however, other applications using similar techniques to bond or solder an assembly.

Figure 1:
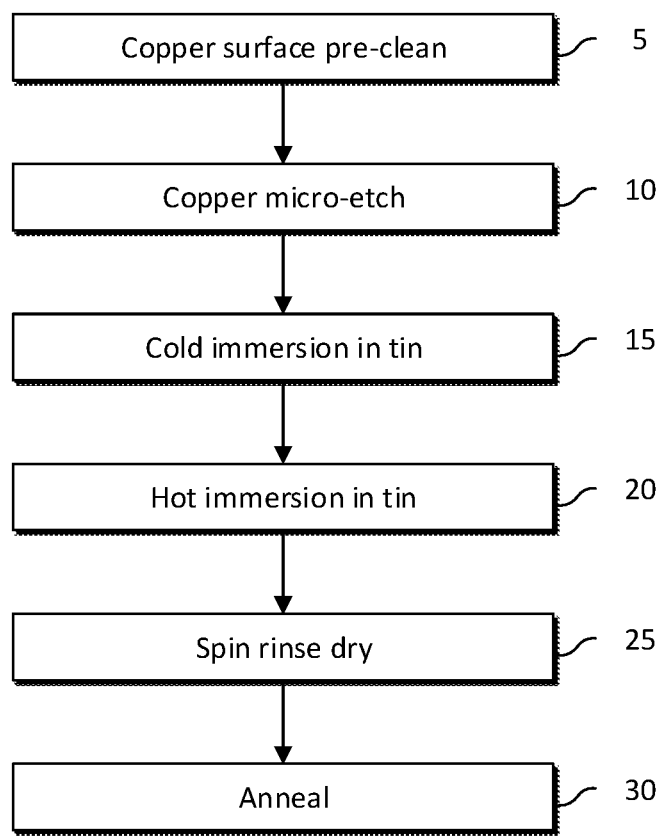
FIG. 1 is a flow chart of process in accordance with an embodiment.

FIG. 1 shows a process in accordance with an embodiment. At the outset, it is assumed that a connector, such as a pillar or bump, is provided comprising copper. This pillar or bump may be applied directly on an electrical pad on a semiconductor chip for a flip chip assembly or other similar application. At step 5, the surface of the copper pillar or bump is pre-cleaned. The pre-clean may be performed by using dilute sulfuric acid ($H_2SO_4$) or other suitable chemicals. The pre-clean may be performed by immersing the surface of a wafer or semiconductor chip on which the pillar or bump is applied into a bath of sulfuric acid or other chemical. Also, the pre-clean may be performed by immersing a batch of wafers vertically into a tank of sulfuric acid or other chemical. The purpose of the pre-clean is to clean the copper surface and remove any copper oxide that may have formed on the surface of the copper. Further, the pre-clean is used to wet the copper surface to aid in preventing voids between the future copper-tin interface.

At step 10, an optional micro-etch is performed on the pillar or bump. The micro-etch is performed to ensure that substantially all of the copper oxide is removed from the surface of the pillar or bump, such that the surface is substantially free of oxygen and/or copper oxide. The micro-etch may be performed using sodium persulfate, sulfuric acid, combinations thereof, or the like.

At step 15, the pillar or bump is immersed into cold tin as a pre-dip. The immersion may be performed by immersing the surface of the wafer or semiconductor chip on which the pillar or bump is applied into a bath of tin that is at or near room temperature, or in other words, between about 20° C. and about 25° C. Also, the immersion may be performed by immersing a batch of wafers vertically into a tank of cold tin. The cold tin may be mixed with a reducing agent, such as thiourea to form a thiourea mixture, to decrease the reaction potential between the copper and tin and to increase chemical reactions.

At step 20, the pillar or bump is immersed into hot tin as a bulk deposition. The immersion may be performed by immersing the pillar or bump into a bath of tin that is between about 40° C. and about 75° C. Further, the immersion may be performed by immersing a batch of wafers vertically into a tank of hot tin. The hot tin may be mixed with a reducing agent, such as thiourea, to decrease the reaction potential between the copper.

By performing the immersions at two different thermal levels, stress created by the chemical reaction between the copper and tin may be released or reduced. For example, at a lower temperature and lower deposition rate, tin atoms have lower bonding energy such that each tin atom is less likely to form a bond with multiple copper atoms, as opposed to when tin is deposited at high temperatures. This avoids the lateral shear force that may occur at the interface between the copper and the copper-tin compound because the tin deposited on the copper is denser such that less stress exists in the copper-tin interface. Then, tin may be deposited at a higher temperature and higher deposition rate onto the previously deposited cold tin. No significant interface stress exists between the cold tin and the hot tin. Therefore, this thermal gradient may help to prevent the formation of voids at the copper-tin interface.

At step 25, a spin rinse dry step is performed to remove excess tin from the pillar or bump and the wafer or semiconductor chip and to dry the reacted copper and tin. The spin rinse dry step may be performed by spinning a wafer and spraying water on the wafer. Then, a nitrogen flow may be applied to the top of the wafer to avoid a water mark residue on the wafer. At step 30, an optional anneal step is performed to further react the tin with the copper. The anneal may be performed in an environment with a temperature between about 100° C. and about 250° C., but generally around 150° C. The anneal may last between thirty minutes and four hours. The anneal may further release stress caused by the chemical reaction between the copper and the tin during the deposition process.

Subsequently, any remaining processing may be performed. For example, the semiconductor chip to which the bump or pillar is applied may be singulated from a wafer, if not performed previously. Also, the semiconductor chip may be soldered to a substrate or carrier using the pillar or bump, and underfill (shown in FIG. 2C as underfill 62) may be applied between the chip and carrier and around the pillar or bump. Different applications will have different processing steps, and the steps recited are merely exemplary.

Figure 2A:
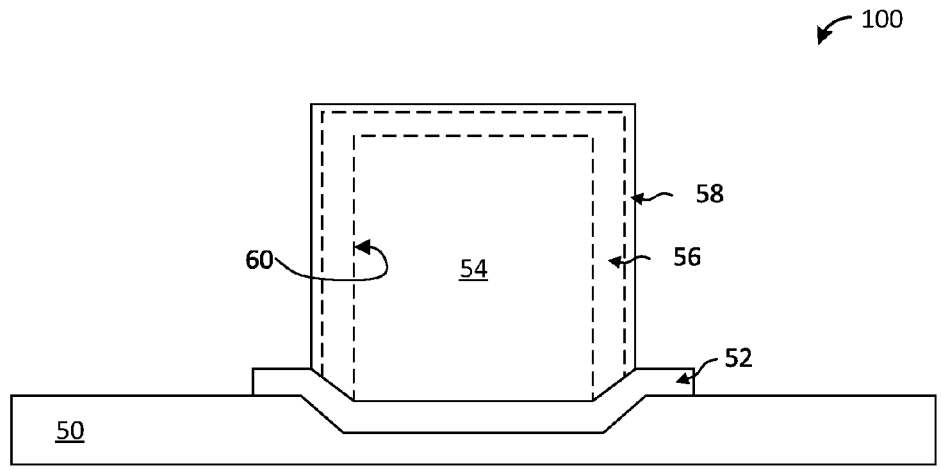
FIG. 2A is a portion of a semiconductor chip processed in accordance with an embodiment.

FIG. 2A is a portion 100 of a semiconductor chip 50 processed in accordance with an embodiment. The chip 50 comprises a pad 52 and a copper pillar 54. The copper pillar 54 is surrounded by a copper-tin compound 56 and a thin layer of unreacted tin 58. The unreacted tin 58 may be reacted with other materials in subsequent processing steps, as may be observed in a final chip or assembly. The copper-tin compound 56 and layer of tin 58 result from the dual thermal level deposition of tin onto the copper pillar 54 as discussed above. The thickness of the copper-tin compound 56 depends on the diffusion and reaction of the tin and the copper during processing. Voids may occur during processing at the copper-tin interface 60 between the copper in the copper pillar 54 and the copper-tin compound 56, but in embodiments, such voids will generally be 100 nanometers in width and smaller rather than up to 200 nanometers in width in the prior art.

Figure 2B:
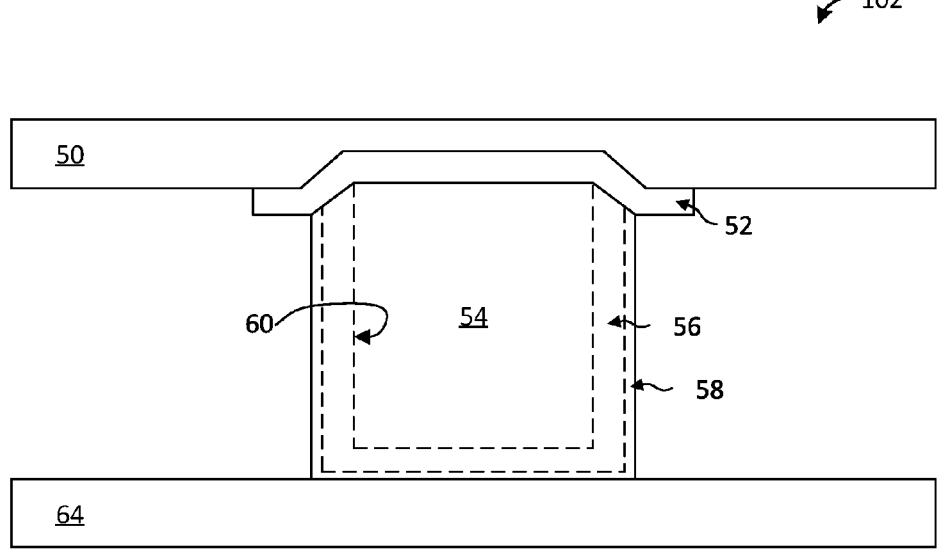
FIG. 2B is the semiconductor chip in a portion of a flip chip assembly in accordance with an embodiment.
Figure 2C:
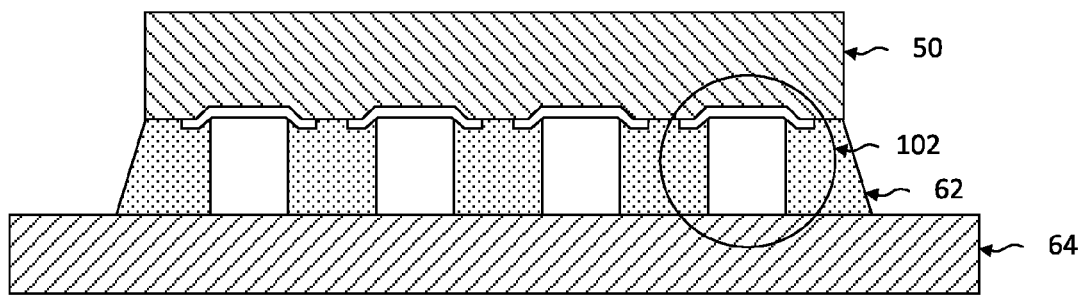
FIG. 2C is a flip chip assembly comprising the portion of the flip chip assembly in FIG. 2B.

FIG. 2B is the semiconductor chip 50 in a portion of a flip chip assembly 102 when the copper pillar is coupled to a package substrate 64. FIG. 2C is a flip chip assembly comprising the portion of the flip chip assembly 102 illustrated in FIG. 2B. The flip chip assembly in FIG. 2C comprises four portions 100, and the corresponding components illustrated in FIGS. 2A and 2B, although only one portion 100 is specifically enumerated. The number of portions 102 as illustrated is not intended to be limiting, but is only illustrative of an embodiment.

By following the process discussed above, the number and size of voids are reduced in the copper-tin interface on a pillar or bump. This may be accomplished first by removing copper oxide on the copper surface and wetting the copper surface during a pre-clean step. The pre-clean step removes irregularities caused by the copper oxide and prevents the presence of bubbles on the copper. The number and size of voids may be reduced by releasing stress at the copper-tin interface by using a thermal gradient deposition of tin onto the copper pillar. Further stress may be released by annealing the copper-tin compound. Although some voids may still occur by using this process, the number and width of voids decrease as compared to conventional processes and structures.

In accordance with an embodiment, a method for forming a semiconductor assembly comprises cleaning a connector comprising copper formed on a substrate, applying cold tin to the connector, applying hot tin to the connector, and spin rinsing and drying the connector.

In accordance with another embodiment, a method for forming a semiconductor assembly comprises pre-cleaning a surface of a copper connector, immersing the surface of the copper connector into a thermal gradient of tin, and spin rinsing and drying the copper connector. The thermal gradient of tin comprises a cold tin immersion and a subsequent hot tin immersion.

In accordance with another embodiment, a semiconductor assembly comprises a semiconductor chip, a pad on the semiconductor chip, a copper connector physically coupled to the pad, and a copper-tin compound layer on a surface of the copper connector. An interface between the copper-tin compound layer and the copper connector is free of voids larger than 100 nanometers in width.

Figure 3:
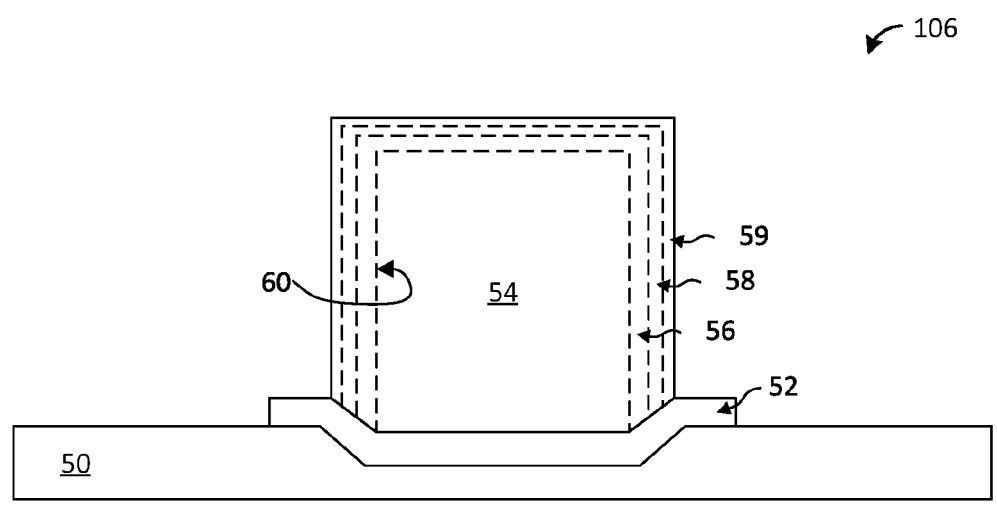
FIG. 3 is a portion of a semiconductor chip processed in accordance with an embodiment.

In accordance with a further embodiment, a semiconductor chip comprises a copper connector, a copper-tin compound layer, a first tin layer, and a second tin layer (shown in FIG. 3 as second tin 59). The copper-tin compound layer is on an exterior surface of the copper connector, and the exterior surface of the copper connector is free of voids greater than 100 nanometers in width. The first tin layer on the copper-tin compound layer, and the second tin layer on the first tin layer.

Although embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A semiconductor assembly comprising:
   a semiconductor chip;
   a pad on the semiconductor chip;
   a copper connector coupled to the pad; and
   a copper-tin compound layer on a surface of the copper connector, wherein an interface between the copper-tin compound layer and the copper connector is free of voids larger than 100 nanometers in width.

2. The semiconductor assembly of claim 1, wherein the surface of the copper connector is substantially free of oxygen.

3. The semiconductor assembly of claim 1, further comprising a substrate coupled to the copper connector.

4. The semiconductor assembly of claim 1, further comprising a first tin layer on the copper-tin compound layer.

5. The semiconductor assembly of claim 4, further comprising a second tin layer on the first tin layer.

6. The semiconductor assembly of claim 1, wherein the copper connector comprises a copper bump.

7. The semiconductor assembly of claim 1, wherein the copper connector comprises a copper pillar.

8. The semiconductor assembly of claim 1, further comprising an underfill surrounding the copper-tin compound layer.

9. A semiconductor chip comprising:
a copper connector;
a copper-tin compound layer on an exterior surface of the copper connector, wherein the exterior surface of the copper connector is free of voids greater than 100 nanometers in width;
a first tin layer on the copper-tin compound layer; and
a second tin layer on the first tin layer.

10. The semiconductor chip of claim 9, further comprising a bump pad, wherein the copper connector is physically coupled to the bump pad.

11. The semiconductor chip of claim 9, wherein the copper connector comprises a copper bump.

12. The semiconductor chip of claim 9, wherein the copper connector comprises a copper pillar.

13. The semiconductor chip of claim 9, wherein the exterior surface of the copper connector is substantially free of copper oxide.

14. A semiconductor device comprising:
a semiconductor chip comprising a copper connector;
a copper-tin compound layer on a surface of the copper connector, wherein an interface between the copper-tin compound layer and the copper connector is free of voids larger than 100 nanometers in width; and
a substrate coupled to the copper connector.

15. The semiconductor device of claim 14, wherein the semiconductor chip further comprises an electrical pad, wherein the copper connector is physically coupled to the electrical pad.

16. The semiconductor device of claim 14, further comprising a first tin layer on the copper-tin compound layer.

17. The semiconductor device of claim 16, further comprising a second tin layer on the first tin layer.

18. The semiconductor device of claim 14, wherein the surface of the copper connector is substantially free of oxygen.

19. The semiconductor device of claim 14, wherein the copper connector comprises a copper bump or a copper pillar.

20. The semiconductor device of claim 14, further comprising an underfill between the substrate and the semiconductor chip, the underfill surrounding the copper-tin compound layer.

* * * * *